(12) United States Patent
Araki et al.

(10) Patent No.: US 8,274,762 B2
(45) Date of Patent: Sep. 25, 2012

(54) METHODS AND SYSTEMS FOR USING RESISTIVITY OF SENSOR FILM IN AN ELEMENT SHUNT

(75) Inventors: Satoru Araki, San Jose, CA (US); Ying Hong, Morgan Hill, CA (US); Edward Hin Pong Lee, San Jose, CA (US); Tsann Lin, Saratoga, CA (US); David John Seagle, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1153 days.

(21) Appl. No.: 12/130,389

(22) Filed: May 30, 2008

(65) Prior Publication Data

US 2009/0296285 A1    Dec. 3, 2009

(51) Int. Cl.
G11B 5/33    (2006.01)
(52) U.S. Cl. ......................................................... 360/324
(58) Field of Classification Search ................... 360/324, 360/324.1, 324.11, 324.12, 324.2
See application file for complete search history.

(56) References Cited

U.S. PATENT DOCUMENTS

| | | | |
|---|---|---|---|
| 5,539,598 A | 7/1996 | Denison et al. ................ 360/113 |
| 5,805,390 A | 9/1998 | Takeura ........................ 360/113 |
| 5,978,181 A | 11/1999 | Niijima et al. ................ 360/113 |
| 6,246,553 B1 | 6/2001 | Biskeborn ..................... 360/323 |
| 6,552,879 B2 | 4/2003 | Voldman ....................... 360/323 |
| 6,650,511 B2 | 11/2003 | Hsiao et al. ................... 360/323 |
| 6,667,842 B2 * | 12/2003 | Comeau et al. ................. 360/67 |
| 6,678,127 B2 | 1/2004 | Hsiao et al. ................... 360/323 |
| 6,927,951 B2 | 8/2005 | Huha et al. .................... 360/323 |
| 6,944,937 B2 | 9/2005 | Hsiao et al. ................ 29/603.09 |
| 7,151,654 B1 * | 12/2006 | Mao et al. ................... 360/324.2 |
| 7,239,488 B2 | 7/2007 | Zhu et al. ...................... 360/323 |
| 7,291,279 B2 | 11/2007 | Dill et al. ........................ 216/22 |
| 7,389,577 B1 * | 6/2008 | Shang et al. ............... 29/603.14 |
| 7,392,579 B2 * | 7/2008 | Leung et al. ............... 29/603.16 |
| 7,706,109 B2 * | 4/2010 | Nichols et al. ............. 360/324.2 |
| 7,707,707 B2 * | 5/2010 | Seagle ....................... 29/603.12 |
| 7,894,168 B2 * | 2/2011 | Kiyono et al. ........... 360/324.12 |
| 2007/0076328 A1 | 4/2007 | Jayasekara et al. ........... 360/373 |

* cited by examiner

Primary Examiner — Angel A. Castro
(74) Attorney, Agent, or Firm — Zilka-Kotab, PC

(57) ABSTRACT

A system in one approach includes a sensor stack formed of a plurality of thin film layers; a shunt formed of at least some of the same layers as the sensor stack, the shunt being spaced from the sensor stack; a first lead coupled to the sensor stack and the shunt; and a second lead coupled to the sensor stack and the shunt. A method in one embodiment includes forming a plurality of thin film layers; removing a portion of the thin film layers for defining at least a portion of a sensor stack and at least a portion of a shunt spaced front the sensor stack; forming a first lead coupled to the at least a portion of the sensor stack and the at least a portion of the shunt and a second lead coupled to the at least a portion of the sensor stack and the at least a portion of the shunt. Additional systems and methods are also presented.

7 Claims, 7 Drawing Sheets

METHODS AND SYSTEMS FOR USING RESISTIVITY OF SENSOR FILM IN AN ELEMENT SHUNT

FIELD OF THE INVENTION

The present invention relates to magnetic sensors, and more particularly, this invention relates to using an element shunt with a magnetic sensor.

BACKGROUND OF THE INVENTION

The heart of a computer is a magnetic disk drive which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

As sensors reduce in size, the sensor resistance increases. However, preamplifiers have a preferable resistance range in which they can supply current through a sensor circuit. Therefore, it would be favorable to put a resistor in parallel with a sensor in as few additional processing steps as possible so that the overall resistance of the sensor circuit falls within the preferable resistance range of the preamplifier.

SUMMARY OF THE INVENTION

A system in one approach includes a sensor stack formed of a plurality of thin film layers; a shunt formed of at least some of the same layers as the sensor stack, the shunt being spaced from the sensor stack; a first lead coupled to the sensor stack and the shunt; and a second lead coupled to the sensor stack and the shunt.

A system in another embodiment includes a sensor stack formed of a plurality of thin film layers; a shunt formed of at least some of the same layers as the sensor stack, the shunt being spaced from the sensor stack; a first lead coupled to the sensor stack and the shunt; a second lead coupled to the sensor stack and the shunt, wherein the leads are positioned to pass a current through the sensor stack in a direction perpendicular to the plane of deposition thereof, wherein the leads are positioned to pass a current through the shunt in a direction parallel to the plane of deposition thereof.

A method in one embodiment includes forming a plurality of thin film layers; removing a portion of the thin film layers for defining at least a portion of a sensor stack and at least a portion of a shunt spaced from the sensor stack; forming a first lead coupled to the at least a portion of the sensor stack and the at least a portion of the shunt and a second lead coupled to the at least a portion of the sensor stack and the at least a portion of the shunt.

A method in another embodiment includes forming a plurality of thin film layers in two sections spaced from one another, one section being at least a portion of a sensor stack, another section being at least a portion of a shunt; and forming a first lead coupled to the at least a portion of the sensor stack and the at least a portion of the shunt and a second lead coupled to the at least a portion of the sensor stack and the at least a portion of the shunt.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

The following description discloses several preferred embodiments of magnetic storage systems, as well as operation and/or component parts thereof.

In one general embodiment, a system comprises a sensor stack formed of a plurality of thin film layers; a shunt formed of at least some of the same layers as the sensor stack, the shunt being spaced from the sensor stack; a first lead coupled to the sensor stack and the shunt; and a second lead coupled to the sensor stack and the shunt.

In another general embodiment, a system comprises a sensor stack formed of a plurality of thin film layers; a shunt formed of at least some of the same layers as the sensor stack, the shunt being spaced from the sensor stack; a first lead coupled to the sensor stack and the shunt; a second lead coupled to the sensor stack and the shunt, wherein the leads are positioned to pass a current through the sensor stack in a direction perpendicular to the plane of deposition thereof, wherein the leads are positioned to pass a current through the shunt in a direction parallel to the plane of deposition thereof.

In another general embodiment, a method comprises forming a plurality of thin film layers; removing a portion of the thin film layers for defining at least a portion of a sensor stack and at least a portion of a shunt spaced from the sensor stack; and forming a first lead coupled to the at least a portion of the sensor stack and the at least a portion of the shunt and a second lead coupled to the at least a portion of the sensor stack and the at least a portion of the shunt.

In another general embodiment, a method comprises forming a plurality of thin film layers in two sections spaced from one another, one section being at least a portion of a sensor stack, another section being at least a portion of a shunt; and forming a first lead coupled to the at least a portion of the sensor stack and the at least a portion of the shunt and a second lead coupled to the at least a portion of the sensor stack and the at least a portion of the shunt.

Figure 1:
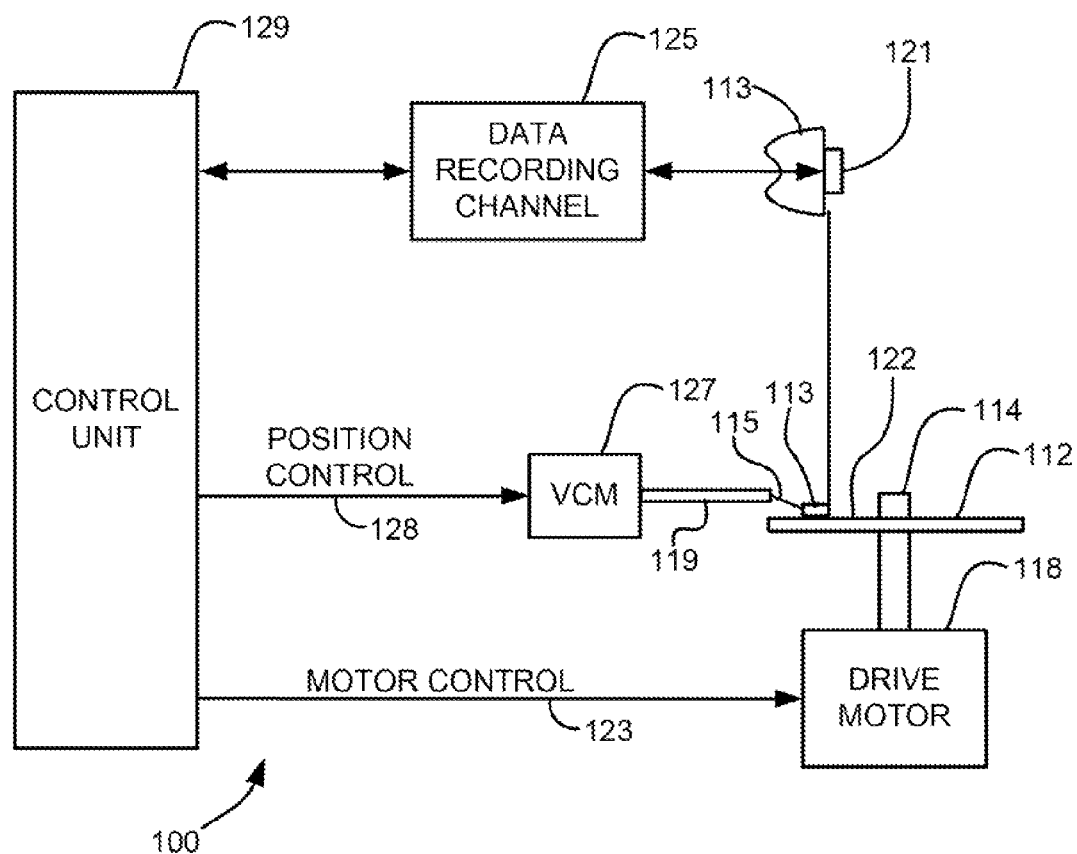
FIG. 1 is a simplified drawing of a magnetic recording disk drive system.

Referring now to FIG. 1, there is shown a disk drive 100 in accordance with one embodiment of the present invention. As shown in FIG. 1, at least one rotatable magnetic disk 112 is supported on a spindle 114 and rotated by a disk drive motor 118. The magnetic recording on each disk is in the form of an annular pattern of concentric data tracks (not shown) on the disk 112.

At least one slider 113 is positioned near the disk 112, each slider 113 supporting one or more magnetic read/write heads 121. As the disks rotate, slider 113 is moved radially in and out over disk surface 122 so that heads 121 may access different tracks of the disk where desired data are recorded. Each slider 113 is attached to an actuator arm 119 by means of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing dining normal operation.

The various components of the disk storage system are controlled in operation by control signals generated by control unit 129, such as access control signals and internal clock signals. Typically, control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write heads 121 by way of recording channel 125.

The above description of a typical magnetic disk storage system and the accompanying illustration of FIG. 1 are for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

A typical head includes a reader and a writer. Typical writers are perpendicular writers, but inductive writers may be used. During writing, magnetic fields emanate from the writer at the air bearing surface (ABS) for the purpose of writing bits of magnetic field information in tracks on moving media, such as in circular tracks on a rotating magnetic disk. During readback, the reader is affected by the magnetic field information on the media, thereby allowing readback of the data.

In other approaches, the reader and writer may be on different heads.

Figure 2:
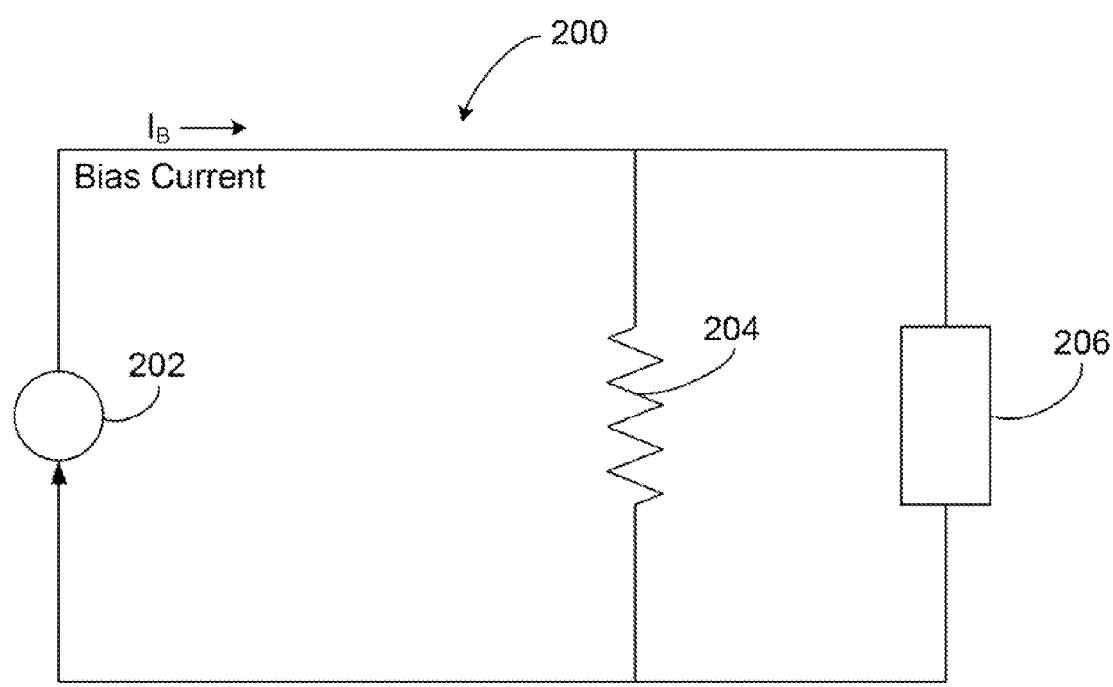
FIG. 2 is a simplified drawing of a magnetic sensor circuit using an element shunt.

FIG. 2 illustrates a simplified sensor circuit 200 according to one embodiment. Here, a bias current source 202 provides a bias current to the circuit 200. The sensor 206 has a predefined resistance range based on its stripe height and track width. The resistance of the shunt 204 can be chosen based on a desired overall resistance of the circuit 200. For example, assume a magnetic tunnel junction sensor 206 has a stripe height of about 100 nanometers (nm), with a track width of about 60 nm, resulting in a resistance of about 667 ohms ($\Omega$). The preamplifer, which can be used as the bias current source 202 in this example, may have a preferable resistance range of about 200$\Omega$ to about 800$\Omega$, with a target resistance of about 400$\Omega$. Therefore, in order to achieve an overall resistance of the sensor circuit of about 400$\Omega$, the shunt 204 should have a resistance of about 1000$\Omega$.

Figure 3:
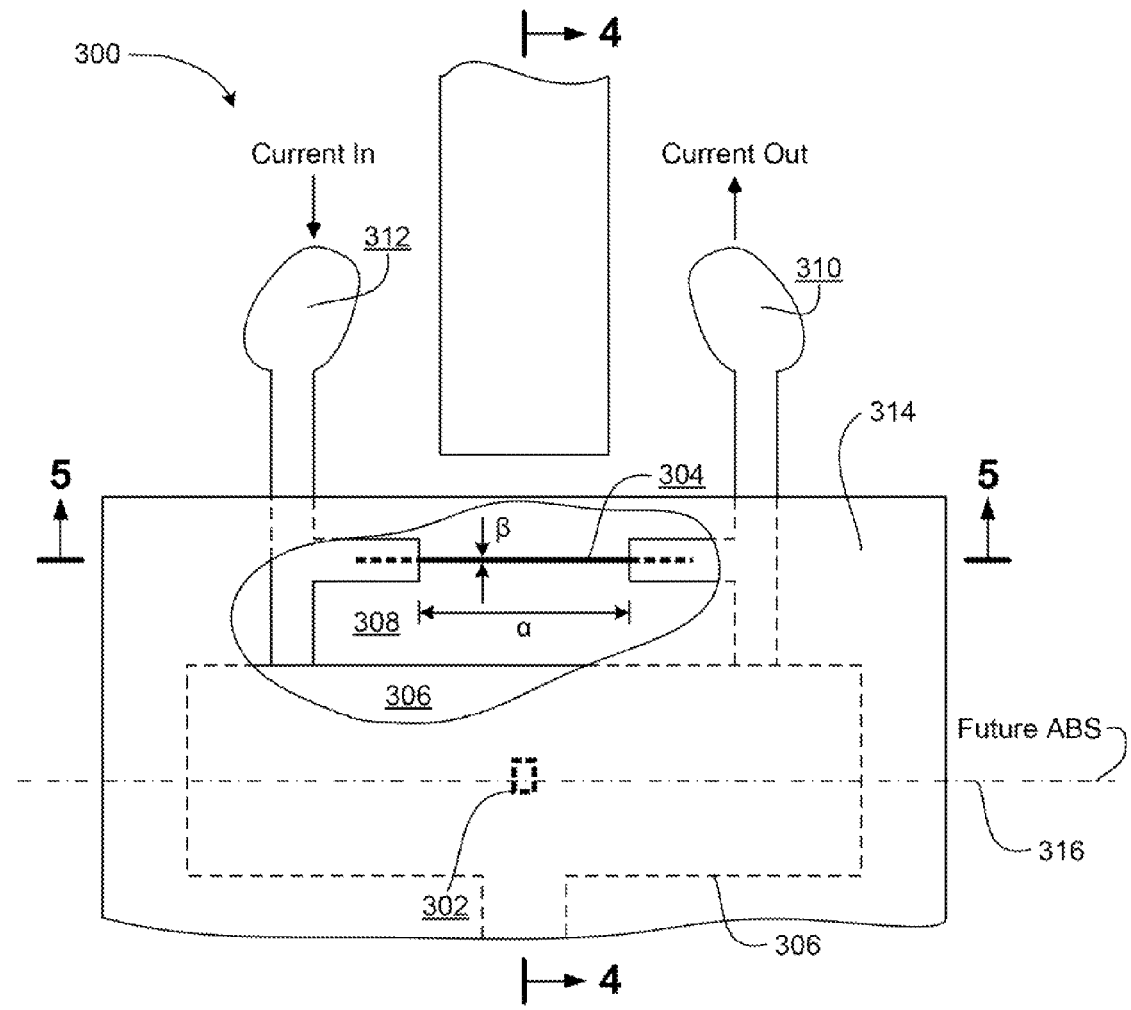
FIG. 3 is a wafer level view of a head design showing both a sensor and a shunt according to one embodiment.

FIG. 3 shows a simplified drawing of a system 300 according to one particularly preferred embodiment. The system includes a sensor stack 302 comprised of a plurality of thin film layers. A shield 306 may overlie the sensor stack 302. A substrate, which may include one or more layers, is used as a base layer to hold the elements of the system 300 in place. A shunt 304, which may be formed of at least some of the same layers as the sensor stack 302 and is spaced from the sensor stack 302, is in place in parallel with the sensor stack 302 to allow for selection of the overall resistance of the sensor circuit. A current is applied to a first lead 312, which is coupled to the sensor stack 302 and the shunt 304. The current passes through both the sensor stack 302 and the shunt 304 to a second lead 310 which is coupled to the sensor stack 302 and the shunt 304. The shunt 304 is surrounded on two sides by a nonconductive layer 308. An extra gap layer 314 is layered on top of portions of the leads 310, 312, the shunt 304, the nonconductive layer 308, and the shield 306. In this and other embodiments, the leads 310, 312, may be a single layer, may be different layers, may be formed of multiple segments, etc. Also, the leads 310, 312, may even include portions of the completed sensor, e.g., one or more shields. Further, the particular configuration shown is not critical, and layers may be added or removed in various embodiments. Also, the materials shown in FIG. 3 are exemplary, and do not limit the choice of material for any component in any way. As an example, a common nonconductive material is alumina ($Al_2O_3$), but the extra gap layer 314 can be comprised of other nonconductive materials such as nonconductive photoresist, metal oxides, ceramic, etc.

A horizontal dashed line 316 which intersects the sensor stack 302 indicates where the ABS will be created in a future processing step. Line 4-4 indicates a cross section view shown in FIG. 4. Line 5-5 indicates another cross section view shown in FIG. 5.

In various embodiments, the leads 310, 312, may be positioned to pass current through the sensor stack 302 in a direction perpendicular to the plane (CPP) of deposition thereof or in a direction parallel to the plane (CIP) of deposition thereof.

In another embodiment, the shunt 304 may be formed of at least two, three, four, five, etc. of the same layers as the sensor stack 302. In a further embodiment, the shunt 304 may be formed of the same layers as the sensor stack 302.

In another embodiment, the shunt 304 lies along a straight line extending between the leads 310, 312.

In yet another embodiment, the leads 310, 312 include portions overlying or underlying ends of the shunt 304. The resistance of the shunt 304 is a function of various parameters, any of which may be defined in any combination to set the shunt resistance value. First, a spacing of the portions of the leads 310, 312 defines a resistance value of the shunt 304. Particularly, the resistance from the shunt is a function of the spacing of the leads 310, 312. For example, the effective length α of the shunt 304 can be increased to increase resistance of the shunt 304, or the length α can be shortened to decrease the resistance of the shunt 304. Also, the height β of the shunt 304 can be increased to decrease the resistance of die shunt 304, or the height β can be shortened to increase the volumetric resistance of the shunt 304. Similarly, a thickness of the shunt 304 affects the volumetric resistance of the shunt.

In one illustrative approach, a net resistance of the sensor stack 302, shunt 304 and leads 310, 312, is between about 200Ω and about 800Ω.

With reference to FIGS. 1 and 3, in another embodiment, the system further includes magnetic media (112, FIG. 1), a head (121, FIG. 1) for reading from the magnetic media, the head having the sensor stack (302, FIG. 3) and the shunt (304, FIG. 3), and a slider (113, FIG. 1) for supporting the head, and a control unit (129, FIG. 1) coupled to the head for controlling operation of the head. These references are for explanatory purposes only, and do not limit the embodiment in any way.

Figure 4:
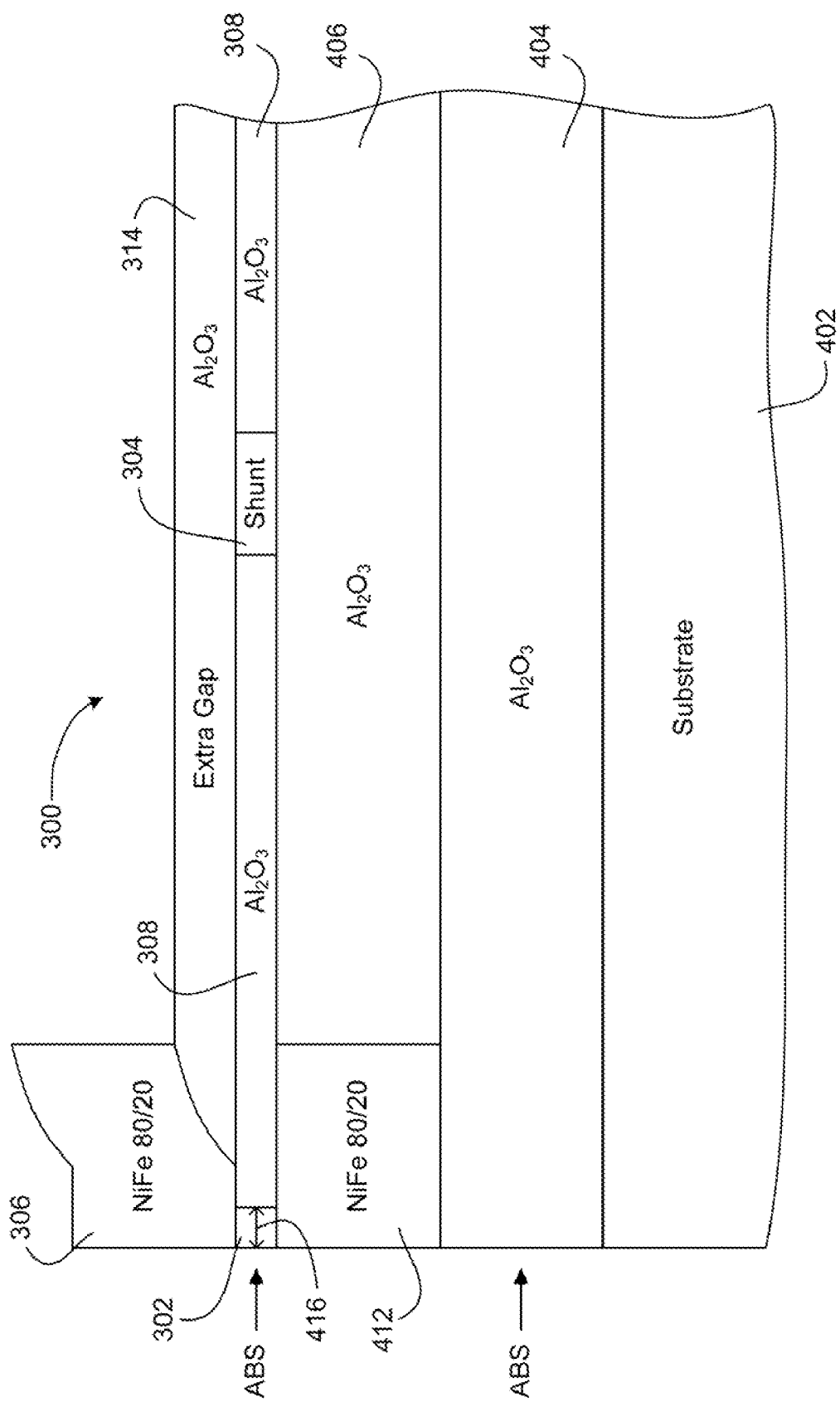
FIG. 4 is a schematic representation of a cross section taken from Line 4-4 on FIG. 3 according to one embodiment.

FIG. 4 is a cross section view of FIG. 3 taken at Line 4-4. In FIG. 4, the structure has been cut on the line indicated as "Future ABS" in FIG. 3 so that the sensor is flush to the ABS. As shown, a substrate 402 supports the rest of the sensor circuit. A nonconductive layer 404, possibly made of alumina ($Al_2O_3$), is formed above the substrate 402. The nonconductive layer 404 can be comprised of any nonconductive material such as alumina, nonconductive photoresist metal oxides, ceramic, etc. The next layer is split, with a first conductive portion 412, e.g., lower shield, near the ABS being a conductive material such as NiFe 80/20 and another portion 406 that is a nonconductive material such as alumina, nonconductive photoresist, metal oxides, ceramic, etc. The next layer has several portions. The first portion, near the ABS, is the sensor 302 which is comprised of sensor material. A CPP sensor 302 should be in electrical communication with the two conductive portions 412, 306, respectively. The stripe height of the sensor 302 is indicated by arrow 416. A nonconductive layer 308 is fanned behind the sensor. The shunt 304 is layered in between the nonconductive layers 308. The shunt 304 may be comprised of sensor material, and is preferably formed at the same time as the sensor 302, and thus comprise at least some of the same material. Above the shunt 304 is an extra gap 314 which may be comprised of a nonconductive material such as alumina, nonconductive photoresist, metal oxides, ceramic, etc. The second conductive portion 306, e.g., upper shield, is layered on top of the sensor 302, and may be comprised of any conductive material such as copper (Cu), gold (Au), NiFe 80/20 (preferred), etc. At this point, the ABS may be defined, as indicated by the arrow labeled ABS. Again, it must be stressed that the embodiment of FIGS. 3-5 is presented by way of example only, and other embodiments may have more, less, or different layers.

Figure 5:
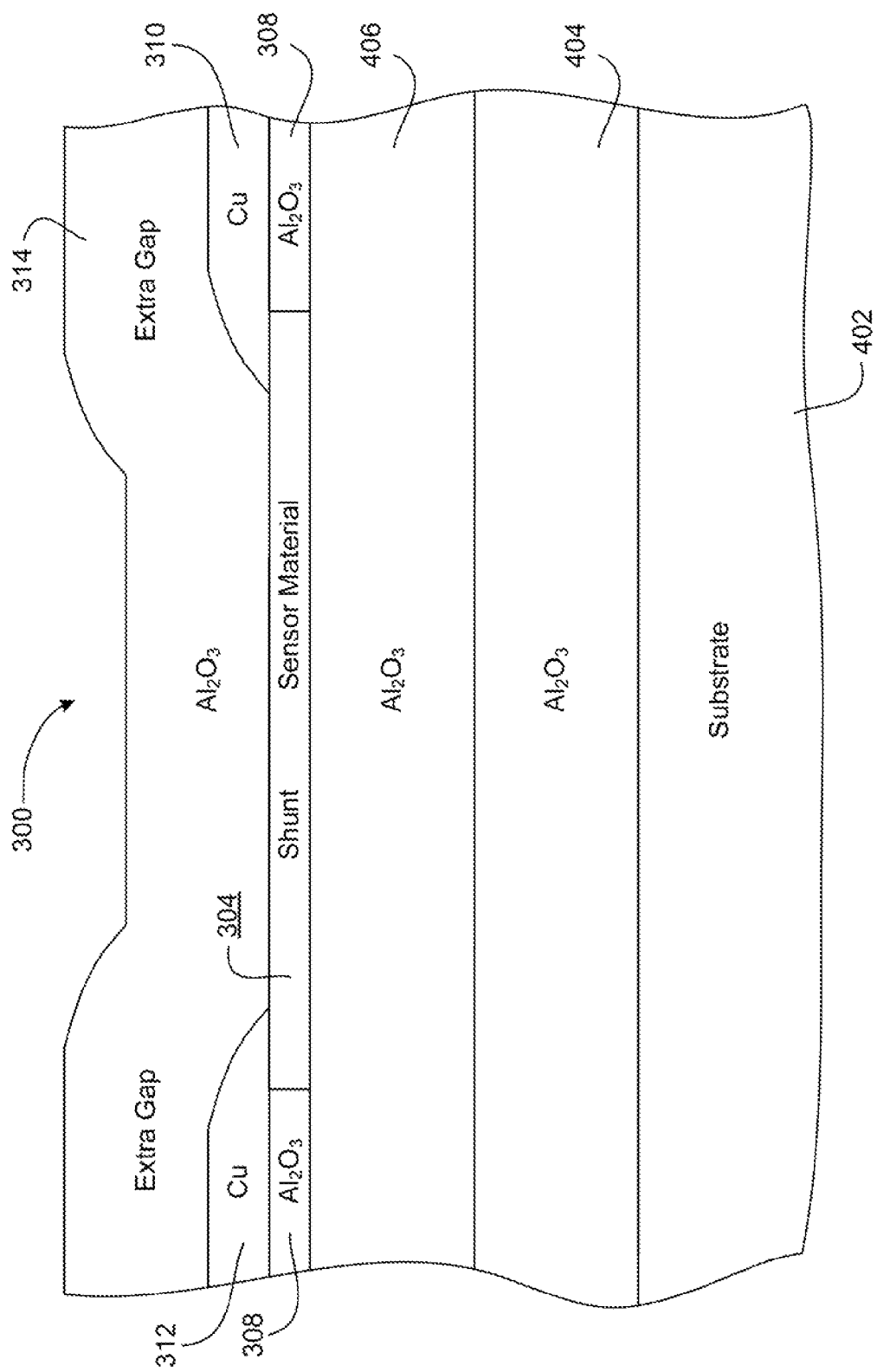
FIG. 5 is a schematic representation of a cross section taken from Line 5-5 on FIG. 3 according to one embodiment.

FIG. 5 is a cross section view of FIG. 3 taken at Line 5-5. As shown, a nonconductive layer 404, possibly made of alumina ($Al_2O_3$), nonconductive photoresist, metal oxides, ceramic, etc., is formed above the substrate 402, with another nonconductive layer 406 above the first nonconductive layer 404. The next layer is the shunt layer; with sensor material comprising the shunt 304 surrounded by two nonconductive layers 308, possibly made of alumina. Any other nonconductive material such as nonconductive photoresist, metal oxides, ceramic, etc. may be used for layer 308. Above the shunt layer and in contact with the shunt 304 on each end are conductive layers 310 and 312, or leads, possibly made of copper (Cu), gold (Au), or some other highly conductive material. On top of the shunt layer and the conductive layers 310 and 312 is the extra gap layer 314 made of a nonconductive material.

Figure 6:
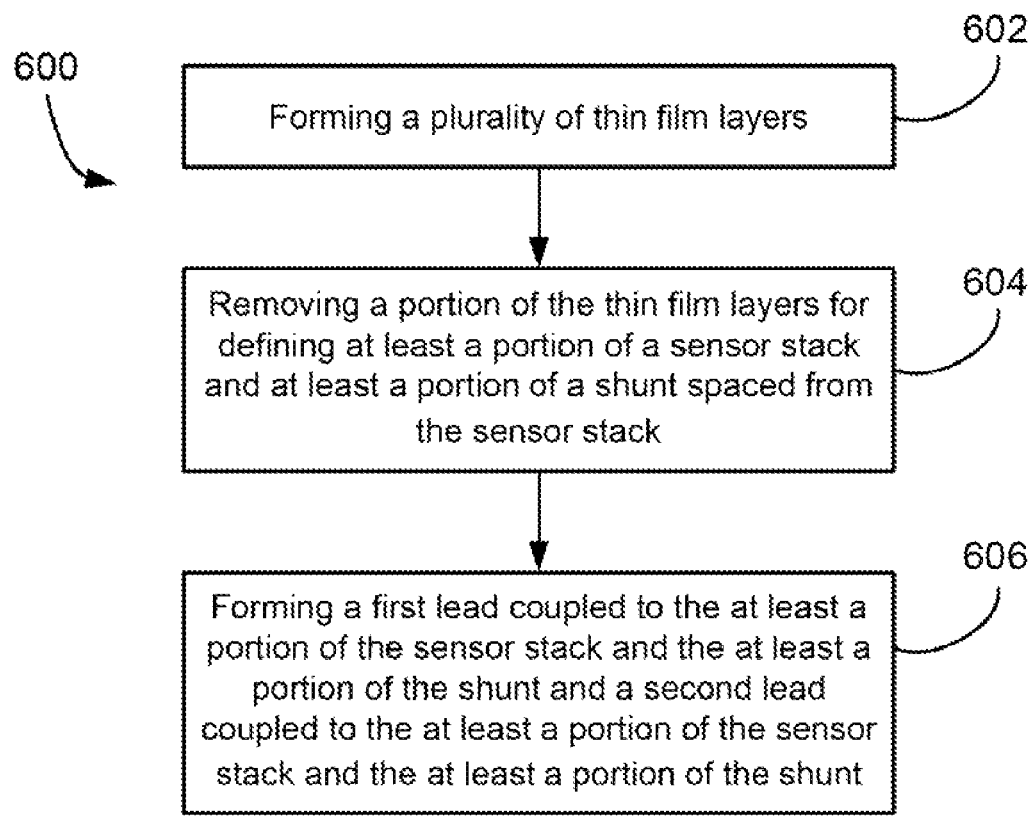
FIG. 6 is a flow diagram of a method according to one embodiment.

FIG. 6 illustrates a method 600 according to one embodiment. As an option the present method 600 may be implemented in the context of the functionality and architecture of FIGS. 1-5. Of course, the method 600 may be carried out in any desired environment. It should be noted that the aforementioned definitions may apply during the present description. Note that in this and other embodiments, standard processes known in the art may be used to form and define the various components.

With continued reference to FIG. 6, in operation 602, a plurality of thin film layers is formed. Any technique suitable for depositing thin film layers may be used in operation 602 as commonly used techniques are acceptable.

In operation 604, a portion of the thin film layers is removed for defining at least a portion of a sensor stack and at least a portion of a shunt spaced from the sensor stack. The sensor stack and the shunt can be comprised of any conductive material, such as copper (Cu), gold (Au), a mixture of 80% nickel and 20% iron (NiFe 80/20), sensor material, etc. In one particularly preferable embodiment the sensor stack and the shunt are comprised of the same materials.

In operation 606, first and second leads coupled to the at least a portion of the sensor stack and the at least a portion of the shunt are formed. The leads can be comprised of any conductive material such as copper (Cu), gold (Au), a mixture of 80% nickel and 20% iron (NiFe 80/20), etc. Note that in other approaches, the leads may be formed by separate processes, or particular portions thereof may be formed separately.

In one embodiment, the leads may be positioned to pass a current through tire sensor stack in a direction perpendicular to the plane (CPP) of deposition thereof or in a direction parallel to the plane (CIP) of deposition thereof.

As noted above, the shunt may include all layers of the sensor stack. In other embodiments, the shunt is formed of at least two, alternatively at least four, of the same layers as the sensor stack, the layers of the sensor stack being positioned between shields.

In yet another embodiment, the shunt may lie along a straight line extending between the leads. For example, in FIG. 3, the shunt 304 is shown in a straight line between the leads 310 and 312.

In one approach, the leads may include portions overlying or underlying ends of the shunt. Also, a spacing of the portions of the leads may define a resistance value of the shunt. Further, the height of the shunt may define a resistance value of the shunt.

In another approach, a net resistance of the sensor stack, shunt, and leads is between about 200Ω and about 800Ω.

Figure 7:
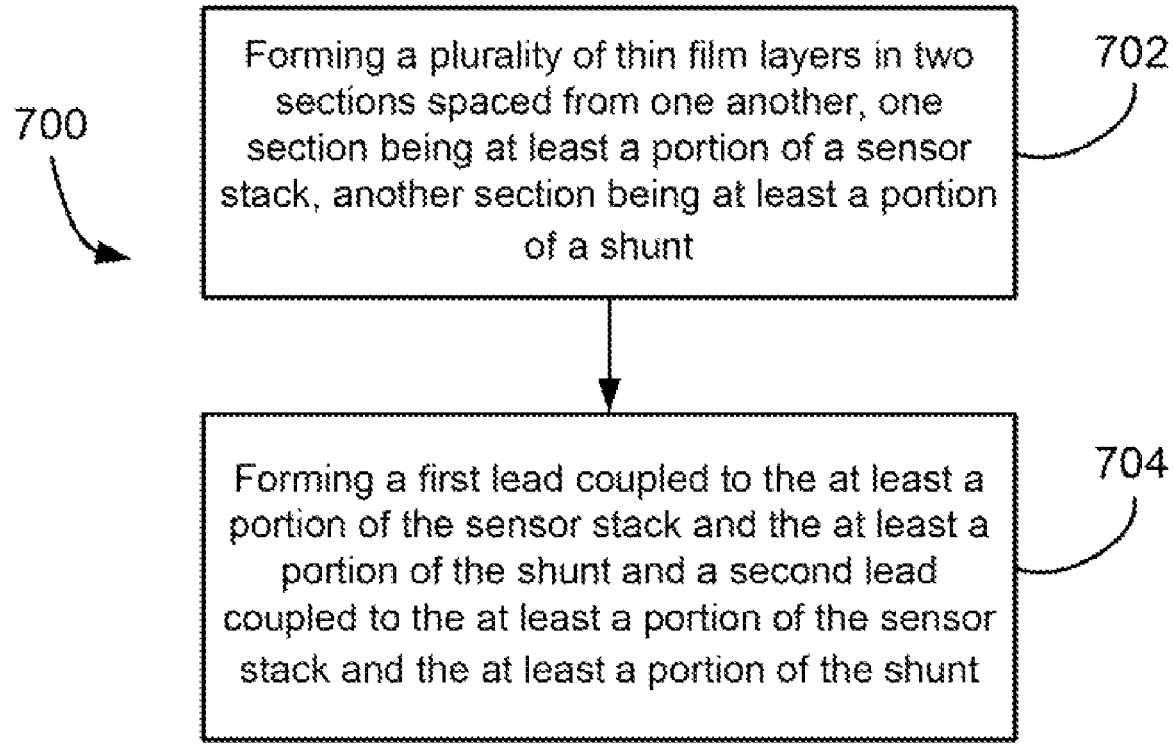
FIG. 7 is a flow diagram of a method according to one embodiment.

FIG. 7 illustrates a method 706 according to one embodiment. As an option the present method 700 may be implemented in the context of the functionality and architecture of FIGS. 1-5. Of course, the method 700 may be carried out in any desired environment. It should be noted that the aforementioned definitions may apply during the present description. Note that in this and other embodiments, standard processes known in the art may be used to form and define the various components.

With continued reference to FIG. 7, in operation 702, a plurality of thin film layers is formed in two sections spaced from one another, one section being at least a portion of a sensor stack, another section being at least a portion of a shunt. Any technique suitable for depositing thin film layers may be used in operation 702 as commonly used techniques are acceptable. The shunt may be comprised of any conductive material, such as copper (Cu), gold (Au), sensor material, a mixture of 80% nickel and 20% iron (NiFe 80/20), etc. In one particularly preferred embodiment, the sensor stack and the shunt are comprised of the same materials.

In operation 704, first and second leads coupled to the at least a portion of the sensor stack and the at least a portion of the shunt are formed. This lead can be comprised of any conductive material such as copper (Cu), gold (Au), a mixture of 80% nickel and 20% iron (NiFe 80/20), etc. Note that in other approaches, the leads may be formed by separate processes, or particular portions thereof may be formed separately.

In one approach, the shunt may lie along a straight line extending between the leads. For example, in FIG. 3, the shunt 304 is shown in a straight line between the leads 310 and 312.

In another approach, the leads may include portions overlying or underlying ends of the shunt.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system, comprising:
    a sensor stack formed of a plurality of thin film layers;
    a shunt formed of at least some of the same layers as the sensor stack, the shunt being spaced from the sensor stack;
    a first lead coupled to the sensor stack and the shunt;
    a second lead coupled to the sensor stack and the shunt;
    an upper shield above the sensor stack and in electrical communication therewith;
    a lower shield below the sensor stack and in electrical communication therewith: and
    an electrically nonconductive extra gap layer formed directly on the shunt,
    wherein the leads are positioned to pass a current through the sensor stack in a direction perpendicular to the plane of deposition thereof,
    wherein the leads are positioned to pass a current through the shunt in a direction parallel to the plane of deposition thereof,
    wherein the leads include portions overlying or underlying ends of the shunt,
    wherein a spacing of the portions of the leads define a resistance value of the shunt.

2. The system of claim 1, wherein the shunt is formed of at least two of the same layers as the sensor stack, the layers of the sensor stack being positioned between shields.

3. The system of claim 1, wherein the shunt is formed of at least four of the same layers as the sensor stack, the layers of the sensor stack being positioned between shields.

4. The system of claim 1, wherein the shunt is formed of the same layers as the sensor stack, the layers of the sensor stack being positioned between shields.

5. The system of claim 1, wherein the shunt lies along a straight line extending between the leads.

6. A system as recited in claim 1, further comprising:
    magnetic media;
    a head for reading from the magnetic media, the head having:
        the sensor stack; and
        the shunt;
    a slider for supporting the head; and
    a control unit coupled to the head for controlling operation of the head.

7. The system of claim 1, wherein the shunt lies along a straight line extending between the leads, wherein a net resistance of the sensor stack, shunt and leads is between about 200 and about 800 ohms, wherein the extra gap layer extends below the upper shield.

* * * * *

UNITED STATES PATENT AND TRADEMARK OFFICE
CERTIFICATE OF CORRECTION

| | | |
|---|---|---|
| PATENT NO. | : 8,274,762 B2 | Page 1 of 1 |
| APPLICATION NO. | : 12/130389 | |
| DATED | : September 25, 2012 | |
| INVENTOR(S) | : Satoru Araki et al. | |

It is certified that error appears in the above-identified patent and that said Letters Patent is hereby corrected as shown below:

In the abstract:

Line 9, replace "front" with --from--.

In the specification:

col. 3, line 39, replace "dining" with --during--;

col. 5, line 13, replace "die" with --the--;

col. 5, line 45, replace "fanned" with --formed--;

col. 6, line 40, replace "tire" with --the--;

col. 6, line 59, replace "706" with --700--.

Signed and Sealed this
Eighth Day of January, 2013

David J. Kappos
*Director of the United States Patent and Trademark Office*